United States Patent
Wang et al.

(10) Patent No.: US 6,392,424 B1
(45) Date of Patent: May 21, 2002

(54) PRESS PLATE OF WIRE BOND CHECKING SYSTEM

(75) Inventors: Chin-Chen Wang, Kaohsiung; Yao-Hsin Feng, Hua-Lien; Su Tao, Kaohsiung, all of (TW)

(73) Assignee: Advanced Semiconductor Engineering Inc., Kaohsuing (TW)

( * ) Notice: Subject to any disclaimer, the term of this patent is extended or adjusted under 35 U.S.C. 154(b) by 0 days.

(21) Appl. No.: 09/373,187

(22) Filed: Aug. 12, 1999

(51) Int. Cl.$^7$ ............................................... G01R 31/02
(52) U.S. Cl. ........................................ 324/754; 324/758
(58) Field of Search ................................ 324/754, 765, 324/72.5, 758, 761, 762; 439/482

(56) References Cited

U.S. PATENT DOCUMENTS

| | | | | |
|---|---|---|---|---|
| 3,453,545 A | * | 7/1969 | Oates | 324/757 |
| 3,611,128 A | * | 10/1971 | Nagata | 324/72.5 |
| 3,648,169 A | * | 3/1972 | Wiesler | 324/762 |
| 3,781,681 A | * | 12/1973 | Wagner et al. | 324/762 |
| 3,891,924 A | * | 6/1975 | Ardezzone et al. | 324/762 |
| 4,056,777 A | * | 11/1977 | Roch | 324/762 |
| 5,712,570 A | | 1/1998 | Heo et al. | 324/538 |

* cited by examiner

*Primary Examiner*—Safet Metjahic
*Assistant Examiner*—Minh N. Tang
(74) *Attorney, Agent, or Firm*—Bacon & Thomas

(57) ABSTRACT

A press plate mainly includes a plate and a probe. The plate has an opening which corresponds to a chip of the substrate and inner finger thereof, and the probe is elastically attached to the edge of the opening for wire bond checking. After the wire bonding process, the wire connecting the chip and the inner finger of the substrate and the probe of the wire bond checking system form a loop. Then a current is sent to the substrate from the wire bond checking system to check for the occurrence of wire occurring lift bond or missing wire.

6 Claims, 4 Drawing Sheets

PRESS PLATE OF WIRE BOND CHECKING SYSTEM

BACKGROUND OF THE INVENTION

1. Field of the Invention

The present invention relates generally to a press plate of wire bond checking system and more particularly to a press plate mounted with a probe of wire bond checking system.

2. Description of the Related Art

In recent years, as the function of IC becomes complicated, there exists a need in the development of packing for an improved high density lead frame. BGA (Ball Grid Array) packages of the electronic and computer industries have been required to support higher lead counts within the same package footprint area. Lift bond or missing wire or bonding pad polluted with compound results in an open loop of the BGA package that causes the BGA package to fail to work. Conventional wire bonding systems, without checking wire bonding, cannot stop bonding immediately and open loops occur during wire bonding. So the wire bond system still continues to use unnecessary wire bonds that increase the cost of product.

U.S. Pat. No. 5,712,570, issued on Jan. 27, 1998 to Heo et al., discloses method for checking wire bond of a semiconductor package. An electroconductive metal layer of gold or copper is grounded on a chip-bonding portion of a PCB (Printed Circuit Board) of the BGA package as well as on a passage extending between the chip bonding-portion and the mold gate of the PCB. After a wire bonding-step, a probe and capillary of a wire bond checking system contact the mold gate and a semiconductor chip, respectively. Then, a current is sent to the BGA package from the checking system to check whether the wire bond is closed or not. When there is neither a lift bond nor a missing wire in BGA package, the wire will send the current. However, the probe of the wire bond checking system damages the mold gate and the semiconductor chip and presses to form a hole in the mold gate during wire bond checking. In addition, substrate of some BGA packages are designed without mold gates, such as the Viper BGA, Micro-Laminate BGA and so on. The wire bond checking system of U.S. Pat. No. 5,712,570 cannot apply to these substrates.

The present invention intends to provide a press plate mounting with a probe in the wire bond checking system. The probe is elastically attached to the press plate and contacts the inner fingers of the substrate during wire bond checking in such a way as to mitigate and overcome the above problem.

SUMMARY OF THE INVENTION

The primary objective of this invention is to provide a press plate of wire bond checking system which includes a press plate with a probe contacting the inner fingers of the substrate during wire bond checking.

The secondary objective of this invention is to provide a press plate of wire bond checking system which includes a probe that is elastically attached to the press plate to reduce damage to the substrate.

The present invention is a press plate of wire bond checking system in accordance with an embodiment; the press plate mainly includes a plate and a probe. The plate has an opening which corresponds to a chip of the substrate and inner finger thereof, and the probe is elastically attached to the edge of the opening for wire bond checking. After the wire bonding process, the wire connecting the chip and the inner finger of the substrate and the probe of the wire bond checking system form a loop. Then a current is sent to the substrate from the wire bond checking system to check for the wire lift bond or missing wire. When the wire bond checking system finds lift bond or missing wire, the wire bonding process stops immediately to avoid unnecessary wire bonding.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

A press plate of the present invention mainly includes a plate and a probe. The plate has an opening which consists of a first hole and a second hole that connects to the edge of the first hole. The first hole corresponds to a chip of the substrate for wire bonding process, and the second hole with the probe corresponds to the inner finger, i.e. ground, of the substrate. An elastic member elastically attaches the probe to the edge of the second hole and the probe contacts the inner finger while wire bond checking. After the wire bonding process, the wire connecting the chip and the inner finger of the substrate and the probe of the wire bond checking system form a loop. Then a current is sent to the substrate from the wire bond checking system to check for wire lift bond or missing wire. When the wire bond checking system finds occurrence of lift bond or missing wire, the wire bonding process will stop immediately to avoid unnecessary wire bonding. A detailed description of the wire bond checking applied in the present invention is described in U.S. Pat. No. 5,712,570. In addition, the elastic member elastically attaches the probe to the edge of the second hole to reduce damage to the substrate while the probe is in contact with the inner finger.

Figure 1:
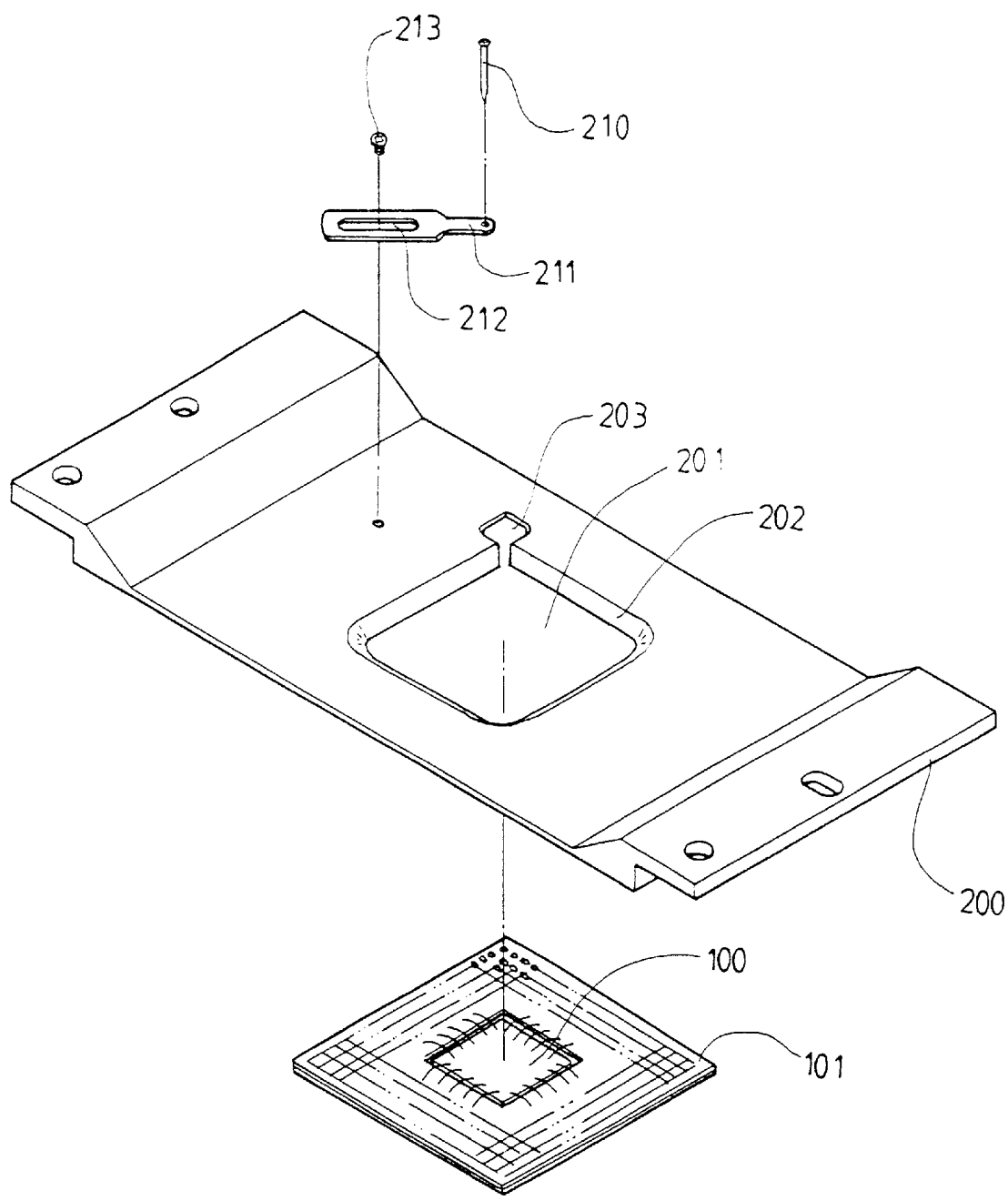
FIG. 1 is a perspective view of a press plate in accordance with a first embodiment of the present invention.
Figure 2:
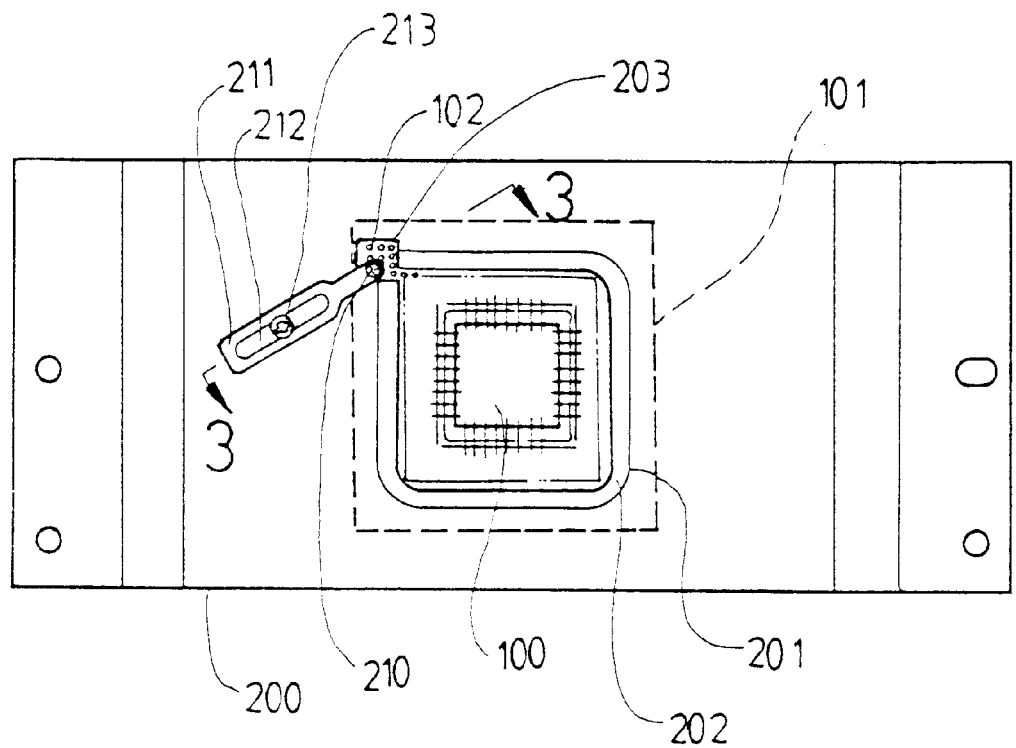
FIG. 2 is a top view of the press plate in accordance with the first embodiment of the present invention.
Figure 3:
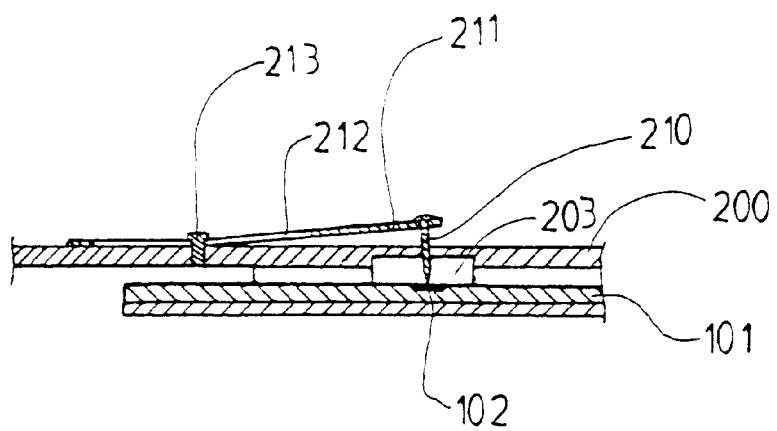
FIG. 3 is a sectional view, taken along 3—3, of the press plate in accordance with the first embodiment of the present invention.

Referring to FIGS. 1, 2 and 3, a press plate in accordance with a first embodiment of the present invention mainly includes a plate 200 and a probe 210. The plate 200 has an opening which consists of a first hole 201 and a second hole 203 which is connected to the edge of the first hole 201. The first hole 201 corresponds to a chip 100 of the substrate 101 for wire bonding process, and the second hole 203 with the probe 210 corresponds to the inner finger 102, i.e. ground, of the substrate 101. The first hole further includes an inclined edge 202 for precisely receiving the capillary (not shown) of the wire bond checking system. An elastic member 211, made of deformable material, elastically attaches the probe 210 to the edge of the second hole 203 and the probe 210 contacts the inner finger 102 causing an appropriate deformation of the elastic member 211 during wire bond checking. One end of the elastic member 211 has an adjusting hole 212 along which adjusts the position of the probe 210 when in contact with the inner finger 102 and fixes the elastic member 211 around the second hole 203 of the plate 200 by a screw 213. The other end of the elastic member 211 attaches to the bottom of the probe 210 which has an end for contact with the inner finger 102 while wire bond checking. After the wire bonding process, the wire interconnecting the chip 100 and the inner finger 102 of the substrate 101 and the probe 210 through the elastic member 211 of the wire bond checking system form a loop. Then a current is sent to the substrate, 101 from the wire bond checking system to check for the occurrence of the lift bond or missing wire. When the wire bond checking system finds a wire closed, the clamp (not shown) of the wire bond checking system cuts the wire in preparation for the next wire bond. When the wire bond checking system finds an occurrence of lift bond or missing wire, the wire bonding process stops immediately to avoid unnecessary wire bonding.

Figure 4:
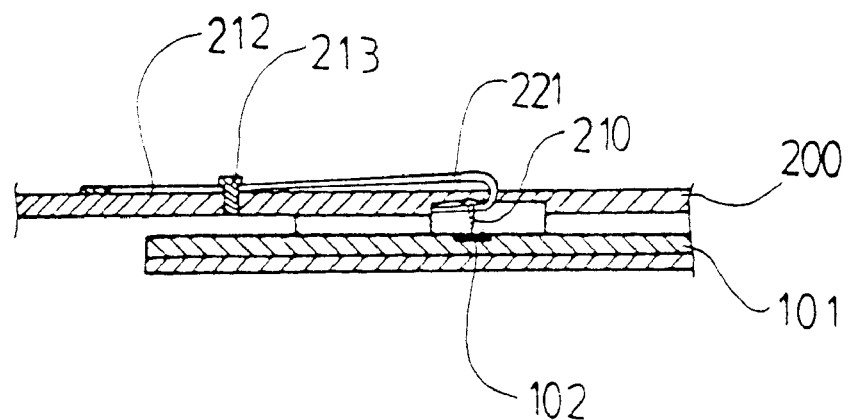
FIG. 4 is a sectional view of a press plate in accordance with a second embodiment of the present invention.

Referring to FIG. 4, a press plate in accordance with a second embodiment of the present invention comprises an elastic member 221 that has two ends. One end of the elastic member 221 has an adjusting hole 212 which adjusts the position of the probe 210 when in contact with the inner finger 102 and fixes the elastic member 221 around the second hole 203 of the plate 200 by a screw 213. The other end of the elastic member 221 has a bent portion which attaches to the bottom of the probe 210 which has an end for contact with the inner finger 102 while wire bond checking. Therefore, the elastic member 221, made of deformable material, elastically attaches the probe 210 to the edge of the second hole 203, and the probe 210 contacts the inner finger 102 and causes an appropriate deformation of the elastic member 221 while wire bond checking.

Figure 5:
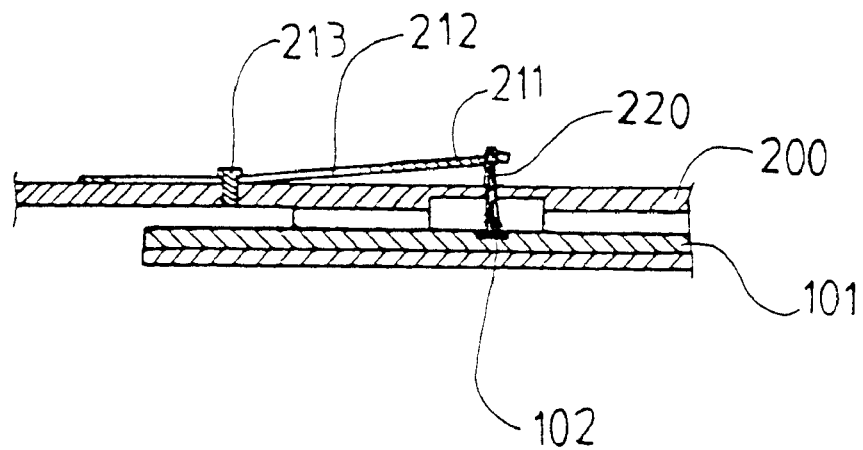
FIG. 5 is a sectional view of a press plate in accordance with a third embodiment of the present invention.

Referring to FIG. 5, a press plate in accordance with a third embodiment of the present invention comprises an elastic member 211 that has two ends. One end of the elastic member 211 attaches to the bottom of the probe 220 which consists of a plurality of wires.

Figure 6:
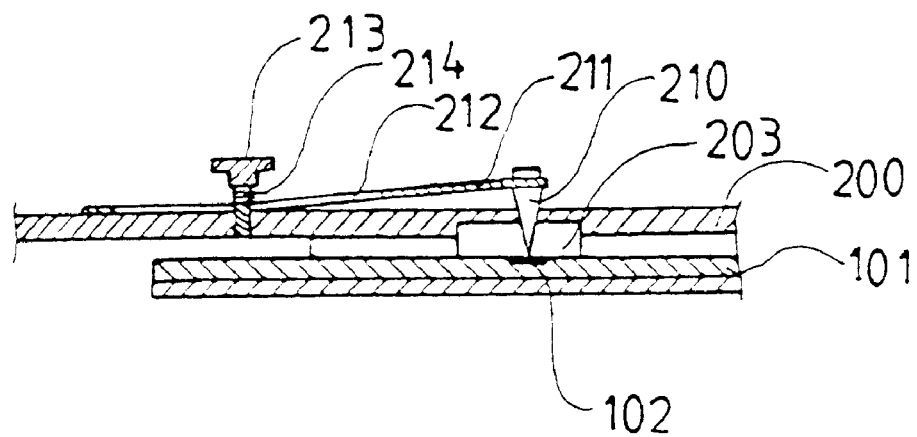
FIG. 6 is a sectional view of a press plate in accordance with a fourth embodiment of the present invention.

Referring to FIG. 6, a press plate in accordance with a fourth embodiment of the present invention comprises an elastic member 211 that has two ends. One end of the elastic member 211 has an adjusting hole 212 which adjusts the position of the probe 210 when in contact with the inner finger 102 and fixes the elastic member 211 around the second hole 203 of the plate 200 by a screw 213 and a spring 214. The other end of the elastic member 211 attaches to the bottom of the probe 210 which has an end for contact with the inner finger 102 while wire bond checking. The spring 214 absorbs the force that pushes on the elastic member 211, when the probe 210 is in contact with the inner finger 102 of the substrate 210.

Figure 7:
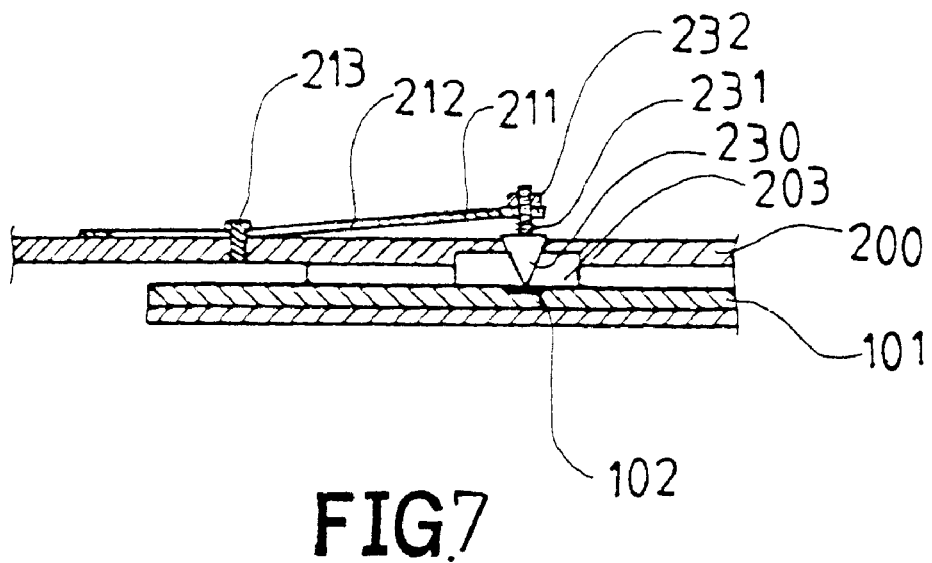
FIG. 7 is a sectional view of a press plate in accordance with a fifth embodiment of the present invention.

Referring to FIG. 7, a press plate in accordance with a fifth embodiment of the present invention comprises an elastic member 211 that has two ends. One end of the elastic member 211 has an adjusting hole 212 which adjusts the position of the probe 230 when in contact with the inner finger 102 and fixes the elastic member 211 around the second hole 203 of the plate 200 by a screw 213. The other end of the elastic member 211 attaches to the bottom of the probe 230 which has an end for contact with the inner finger 102 while wire bond checking. The probe 230 is mechanically attached to the end of the elastic member 211 by a spring 231 and a nut 232. The spring 231 absorbs the force that pushes on the probe 230 when the probe 210 is in contact with the inner finger 102 of the substrate 210.

Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A press plate for wire bonding checking comprising:
   a press plate having a first hole and a second hole therein, wherein said first hole is provided for a chip of a substrate to process a wire bonding process, and said second hole is abutting said first hole and provides for an inner finger of the substrate;
   probe means electrically coupled to a checking system;
   a screw; and
   an elastic member having an adjusting hole to provide said elastic member an adjustable mounted position so that said elastic member can attach resiliently to said probe means when said elastic member is mounted to said press plate by said screw, said probe means then through said second hole to contact with the inner finger of said substrate.

2. The press plate of claim 1, wherein said first hole includes an inclined edge for precisely receiving the capillary of the wire bond checking system.

3. The press plate of claim 1, wherein said elastic member has a bent portion attaching to a bottom of said probe means, so that said probe means has an end through said second hole contact resiliently to said inner finger of said substrate.

4. The press plate of claim 1, wherein said probe means are consisting of a plurality of wires.

5. The press plate of claim 1, further comprising a spring in between said screw and said elastic member so that said spring provides said probes means having an end contact resiliently to said inner finger of said substrate.

6. The press plate of claim 1, wherein said probe means are mechanically attached to an end of said elastic means by a spring and a nut so that said spring provides said probes means having an end contact resiliently to said inner finger of said substrate.

* * * * *